United States Patent [19]

Preves et al.

[11] Patent Number: 4,790,018

[45] Date of Patent: Dec. 6, 1988

[54] FREQUENCY SELECTION CIRCUIT FOR HEARING AIDS

[75] Inventors: David A. Preves, Edina; William A. Johnson, Minneapolis, both of Minn.

[73] Assignee: Argosy Electronics, Eden Prairie, Minn.

[21] Appl. No.: 13,376

[22] Filed: Feb. 11, 1987

[51] Int. Cl.⁴ ........................ H04R 25/00; H04R 3/00; H03G 3/00; H03G 5/00

[52] U.S. Cl. ........................ 381/68.2; 381/68; 381/68.4; 381/98; 381/101

[58] Field of Search ........................ 381/68.2, 68, 68.4, 381/120, 94, 98, 71, 101; 379/388

[56] References Cited

U.S. PATENT DOCUMENTS

| | | | |
|---|---|---|---|
| 3,209,083 | 9/1965 | Posen | 381/68 |
| 3,231,686 | 1/1966 | Hueber | 381/68.4 |
| 3,764,745 | 10/1973 | Bottcher et al. | 381/68 |
| 3,818,149 | 6/1974 | Stearns et al. | 381/68.2 |
| 3,920,931 | 11/1975 | Yanick, Jr. | 381/68.2 |
| 3,928,733 | 12/1975 | Hueber | 381/68.4 |
| 3,967,064 | 6/1976 | Sigworth | 381/94 |
| 4,025,721 | 5/1977 | Graupe et al. | 381/68.2 |
| 4,119,814 | 10/1978 | Harless | 381/68.2 |
| 4,393,275 | 7/1983 | Feldman et al. | 381/68.4 |
| 4,405,831 | 9/1983 | Michelson | 381/68.4 |
| 4,425,481 | 1/1984 | Mansgold et al. | 381/68.2 |
| 4,454,609 | 6/1984 | Kates | 381/68 |
| 4,490,585 | 12/1984 | Tanaka | 381/68 |
| 4,508,940 | 4/1985 | Steeger | 381/68.2 |
| 4,589,136 | 5/1986 | Poldy et al. | 381/71 |
| 4,596,902 | 6/1986 | Gilman | 381/68.2 |
| 4,622,692 | 11/1986 | Cole | 381/68.4 |

FOREIGN PATENT DOCUMENTS

| | | | |
|---|---|---|---|
| 59-72851 | 4/1984 | Japan | 381/94 |
| 718946 | 2/1980 | U.S.S.R. | 381/120 |
| 718947 | 2/1980 | U.S.S.R. | 381/120 |

*Primary Examiner*—Jin F. Ng
*Assistant Examiner*—Danita R. Byrd
*Attorney, Agent, or Firm*—Orrin M. Haugen; Thomas J. Nikolai; Frederick W. Niebuhr

[57] ABSTRACT

A signal processing circuit for hearing aids includes a broadband peak detector for generating a control voltage based upon the sound pressure level of an incoming acoustical signal over its entire frequency spectrum. The control signal is used to determine the cut-off frequency of a voltage controlled adaptive high-pass filter. An amplified electrical signal, corresponding to the acoustical signal, also is provided to the high-pass filter. In setting the cut-off frequency, the control voltage causes the high-pass filter to selectively suppress the low frequency portion of the signal, generating a modified signal in which the noise component is reduced.

17 Claims, 4 Drawing Sheets

FREQUENCY SELECTION CIRCUIT FOR HEARING AIDS

BACKGROUND OF THE INVENTION

This invention relates to electrical circuits for processing sensed audio signals, and more particularly to hearing aid circuits for selectively suppressing noise in low and medium frequency ranges.

With increasingly sophisticated tools at their disposal, designers of hearing aids are addressing one of the more difficult challenges in the design of quality hearing aids; the rejection of environmental noise. The power spectral energy of background noise is predominantly in the low audible frequency ranges, and tends to mask out relatively weaker high frequency components of speech. People with cochlear hearing impairments typically have trouble discriminating between speech and background noise, probably due to their greater susceptibility to masking as compared to persons with normal hearing. The problem is particularly acute in factories, at large social gatherings or other high background noise environments.

Generally, techniques to counter this problem involve improving the signal to noise ratio, emphasizing high frequency signals. The hearing aid microphone can be located where head diffraction is most favorable, directional microphones may be employed, or the user fit with binaural hearing aids.

Signal processing techniques, particularly high-pass filtering, are frequently utilized. U.S. Pat. No. 4,490,585, to Tanaka shows a low frequency detecting circuit, the output of which is provided to an automatic high-pass filter circuit in order to change the cut-off frequency of the automatic filter circuit in accordance with the level of the detecting circuit output. U.S. Pat. No. 4,119,814 to Harless granted Oct. 10, 1978, describes a continuously controlled or switched transistor circuit for increasing the cut-off frequency, above which there is provided a twelve dB/octave rise in response.

Another common related approach is to divide the hearing aid microphone output into separate frequency bands. In U.S. Pat. No. 4,596,902 to Gilman granted June 24, 1986, a processor compares actual sound pressure levels with desired levels in each band, and controls amplifiers associated with particular bands to obtain the desired output levels.

While such systems can be satisfactory in their processing of signals, they frequently utilize complex circuitry that is costly, and requires a hearing aid sufficiently large to accommodate the circuitry, in direct conflict with the customer's desire for a hearing aid as small and unobtrusive as possible. Furthermore, hearing aids which employ only low frequency sound to control a variable cut-off frequency cannot respond to excessive background noise in medium frequency ranges. And, when additional amplification in the form of automatic gain control is required, the accompanying attack and recovery artifacts of automatic gain control circuitry interfere with the processed audible signal.

Therefore, it is an object of the present invention to provide hearing aid circuitry which selectively suppresses low and medium frequency noise components, responsive to substantially the entire frequency spectrum of sound.

Another object is to provide a hearing aid with simple signal processing circuitry which can be implemented as a single monolithic integrated circuit chip.

A further object of the invention is to provide a signal processing circuit utilizing adaptive high-pass filtering without the need for automatic gain control circuitry.

Yet another object of the invention is to provide a process and apparatus for selectively enhancing part of an audio signal, utilizing adaptive high-pass filtering controlled in response to the broadband audio signal.

SUMMARY OF THE INVENTION

To achieve these and other objects, there is provided a signal processing circuit for a hearing aid. The circuit includes a sound pressure level sensing means for sensing an audio signal and generating an electrical signal corresponding to the sensed audio signal. The circuit further includes a broadband signal amplifying means for amplifying the electrical signal. Substantially the entire frequency spectrum of the amplified electrical signal is provided as an input to a broadband peak detecting means, which generates a control signal having a control signal level proportional to the amplified electrical signal. Also provided is an adaptive high-pass filtering means, having as a first input the amplified electrical signal, and as a second input the control signal. The filtering means selectively suppresses a low frequency portion of the amplified electrical signal to generate a modified signal. The frequency bandwidth of the suppressed low frequency portion, relative to the entire frequency spectrum of said amplified electrical signal, increases and decreases as the level of said control signal increases and decreases, respectively. A receiver means of the circuit generates an audio signal corresponding to the modified signal.

Preferably, it is the voltage level of the control signal which determines the relative width of the low frequency portion by determining the location, within the frequency spectrum of each hearing aid output or processed signal, of a variable cut-off frequency.

The detecting means can include a rectifier and a smoothing filter, with a hold capacitor of the smoothing filter having a capacitance selected to provide an optimum balance between rapid response to changes in the amplified electrical signal, and the smoothing capacity of the filter.

To adjust the amount of change in the cut-off frequency responsive to a particular change in control voltage level, additional circuitry can be employed for providing, as an input to the high-pass filter means, a predetermined fraction of the output of the detecting means. Also, the cut-off frequency location in quiet environments can be adjusted by bleeding off a portion of the peak voltage sensed by the rectifier using a shunt resistance between the rectifier output and a node biased to a select positive voltage.

A significant advantage of the present invention resides in the fact that substantially the entire amplified signal, and not merely a portion of the signal corresponding to low frequency sound, is used to control the adaptive high-pass filter. One result is a control signal which causes significantly wider variations in the high-pass filter cut-off frequency, thus to more effectively suppress low frequency noise. Also, the highpass filter responds to noise in the medium frequency ranges, a function not possible when the control signal is determined using only low frequency input.

More particularly, at sound pressure input levels of up to about eighty dB, a circuit in accordance with the present invention reduces principally low frequency gain. Above eighty-five dB sound pressure level, however, the circuit reduces gain at mid and high frequencies, thus to prevent the hearing aid from saturating. In prior art hearing aids, a single channel input AGC or compression circuit was required for this function. Consequently, the present circuit avoids the need for such AGC or compression circuit, thereby eliminating the attack and recovery artifacts attendant with such circuits. As a consequence of eliminating the automatic gain control circuitry and the low-pass filter prior to the peak detector, the circuit occupies less space, and therefore is better suited to placing on a single semiconductor chip.

IN THE DRAWINGS

These and other features and advantages will become apparent upon consideration of the following detailed description in view of the drawings, in which.

DETAILED DESCRIPTION OF THE PREFERRED EMBODIMENT

Figure 1:
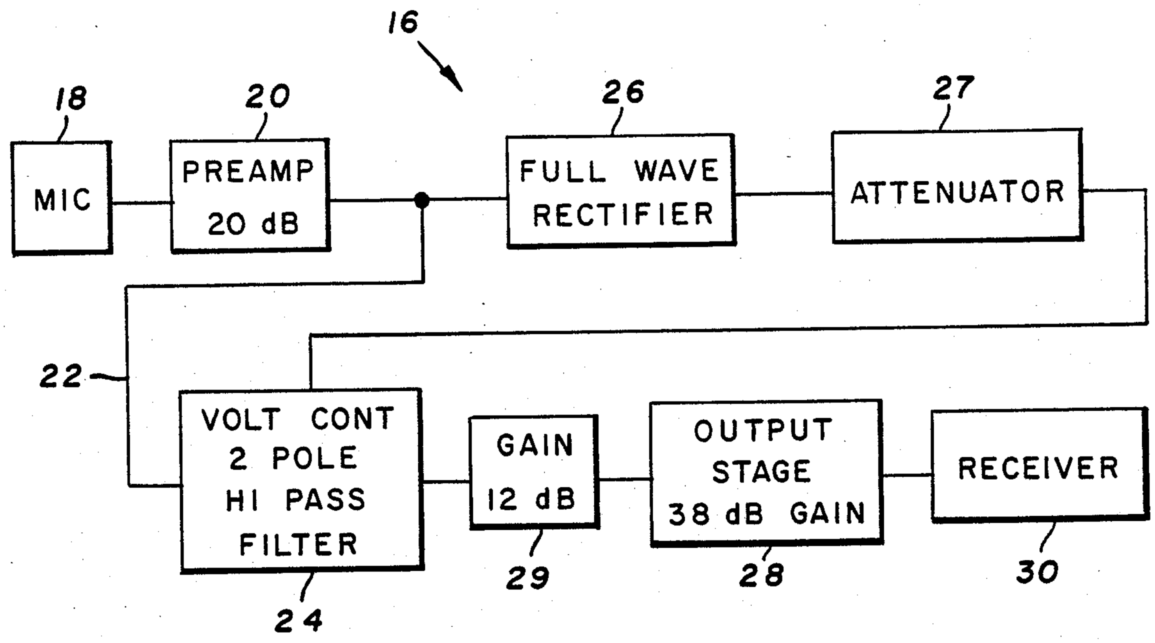
FIG. 1 is a block diagram of a signal processing circuit for a hearing aid, constructed in accordance with the present invention.

Turning now to the drawings, there is shown in FIG. 1 and in block diagram form, a signal processing circuit 16 used in a hearing aid to selectively amplify received audio signals. In practice, the circuit converts each audio signal received into a modified signal enhanced in its upper frequency range. Further, the bandwidth of the enhanced upper frequency range, relative to the signal as a whole, varies with the power level of the incoming audio signals. Circuit 16 includes a microphone 18 for receiving acoustic signals and converting them to electrical signals. A broadband pre-amplifier 20 receives the output of microphone 18 and provides a twenty dB amplification to generate an amplified electrical (i.e. voltage) signal proportional to the electrical signal.

The amplified electrical signal is provided to two paths: a signal sensing path represented by a line 22 from pre-amplifier 20 to a voltage controlled high-pass filter 24, and a control path which runs from pre-amplifier 20 and includes a full wave rectifier 26 to a control input of the high-pass filter, and an attenuator 27 between the rectifier and high-pass filter.

Rectifier 26 generates a control voltage signal, which is a direct current voltage proportional to the peak voltage level of the amplified electrical signal from pre-amplifier 20, which in turn is proportional to the sound pressure level of the acoustical signal received by microphone 18. Rectifier 26 and pre-amplifier 20 have broadband characteristics, whereby the pre-amplifier generates a signal based on substantially the entire bandwidth of the received acoustical signal, and the control voltage signal is based on substantially the entire bandwidth of the pre-amplifier output.

Filter 24 is a two-pole high-pass filter with a variable three dB cut-off frequency controlled by the control signal voltage in an adaptive manner. More particularly, the cut-off frequency rises with increases in the control voltage signal level, and falls as the level of the control signal is reduced. Voltage controlled filter 24 selectively suppresses a low frequency portion of the pre-amplifier output signal. The cut-off frequency divides the amplified voltage signal into a high frequency portion above the cut-off frequency, and a low frequency portion below the cut-off frequency. The low frequency portion of the signal is significantly suppressed, while the high frequency portion of the signal is only slightly suppressed. As a result, the output from voltage controlled high-pass filter 24 is a modified electrical signal with its high frequency portion enhanced relative to the signal as a whole.

Following the high-pass filter, the modified electrical signal is subjected to a twelve dB gain stage 29, after which an output stage 28 further amplifies the signal with a thirty-eight dB gain, and provides impedance matching and a selected clipping level for a receiver 30, which converts the modified electrical signal into an acoustical signal to be received by the ear.

Figure 2:
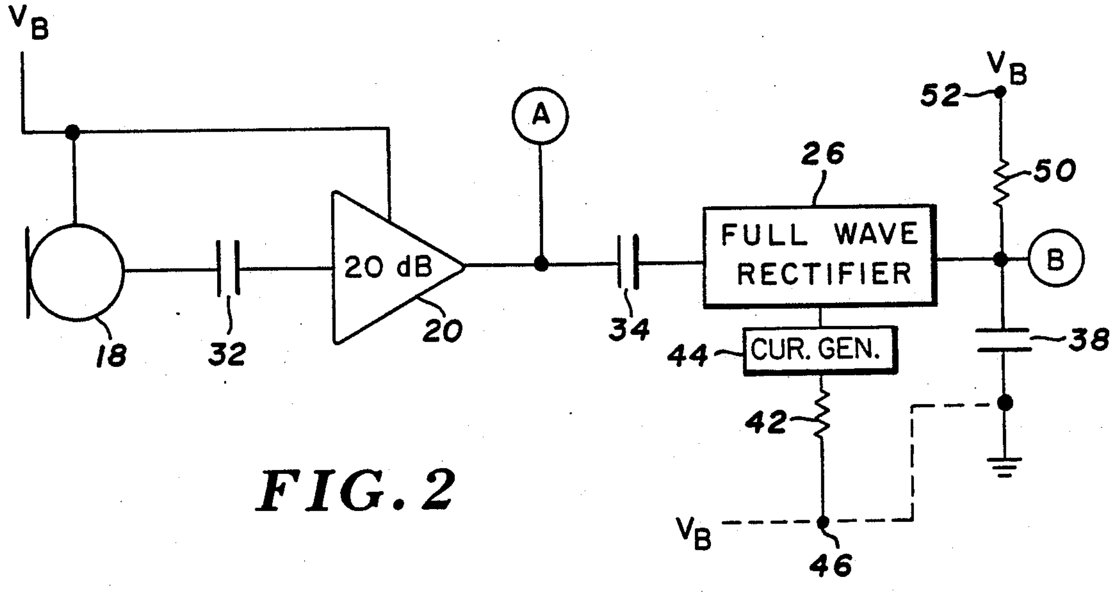
FIG. 2 is a more detailed view of a portion of the signal processing circuit illustrated in FIG. 1.

FIG. 2 shows that portion of the circuit of FIG. 1 that includes microphone 18, pre-amp 20 and rectifier 26. The output of microphone 18 is supplied to pre-amplifier 20 (biased to a positive voltage level $V_B$) through a conductive path including a capacitor 32. The pre-amplifier output is supplied to high-pass filter 24 at a signal input node A, and also through a capacitor 34 to a rectifier 26 and filter including a hold capacitor 38. The rectifier output is supplied to voltage controlled high-pass filter 24 at a control node B (attenuator 27 is not shown here). Hold capacitor 38 functions as a smoothing filter, and determines the rate of change in the cut-off frequency of high-pass filter 24. The larger the capacitance of hold capacitor 38, the smoother is the direct current control voltage output from the rectifier. A reduced capacitance in hold capacitor 38, however, increases the sensitivity of the high-pass filter in that it reduces the time required for filter 24 to react to a change in background noise. As a consequence, the value of hold capacitor 38 is selected for an optimal balance between sensitivity and smoothing capability.

A resistor 42 may be optionally connected between a current generator 44, and a node 46 connected to ground or $V_B$. Normally, without resistor 42, the current supplied to rectifier 26 is on the order of one microamp. Due to this extremely low current, and the relatively low twenty dB gain of pre-amplifier 20, rectifier 26 has a wide dynamic range, i.e. it is sensitive to low sound pressure level input yet maintains a substantially linear response at high SPL input. As shown by the broken line to node 46, this node, as an alternative, can be biased to a voltage level $V_B$. The high-pass filter sensitivity, i.e. the excursions of the cut-off frequency in response to changes in sound pressure level, is increased by the biasing to $V_B$ as opposed to connection to ground.

A cut-off frequency control circuit includes a shunt resistor 50 provided between a node 52 biased to $V_B$ and an output node of rectifier 26. This optional circuitry bleeds off a portion of the voltage signal produced by the rectifier. The selection of resistor 50 controls the location of the cut-off frequency of high-pass filter 24 in relatively quiet environments. In particular, the lower the resistance of shunt resistor 50, the greater is the amount of current bled off from rectifier 26, and the higher is the initial three dB cut-off frequency of the high-pass filter. Consequently, a hearing aid dispenser or clinician can set the shunt resistor to customize the "quiet background" cut-off frequency for a given individual.

Figure 3:
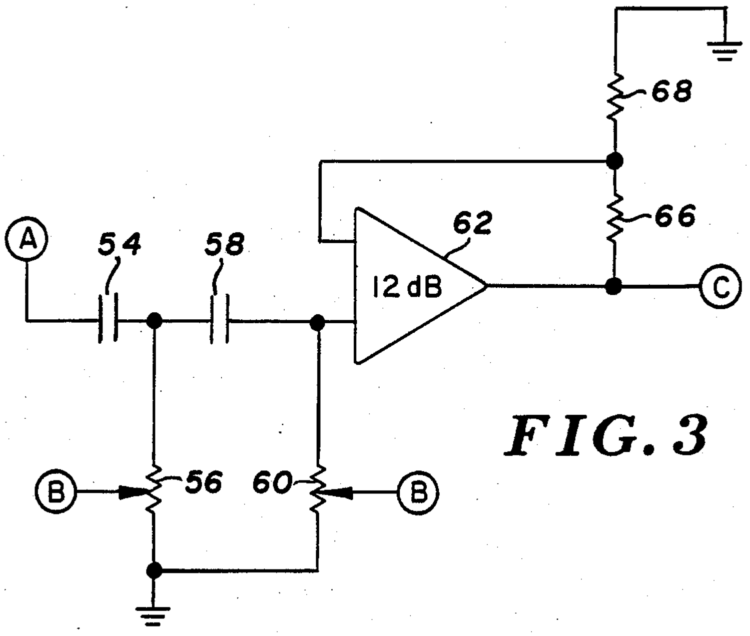
FIG. 3 is a schematic view of a voltage controlled high-pass filter and twelve dB gain amplifier of the signal processing circuit illustrated in FIG. 1.

As seen from FIG. 3, there is one capacitor and one varying resistance associated with each pole of voltage controlled high-pass filter 24; a first capacitor 54 and first resistance 56, and a second capacitor 58 and second variable resistance 60, respectively. Each of variable resistances 56 and 60 is synthesized by transistor circuitry which presents a variable impedance. The cut-off frequency of the high-pass filter is determined by the resistance/capacitance products of each of the two poles. The amplified electrical signal from pre-amplifier 20 is supplied to an input node A of the filter, while the rectifier output is supplied to control node B. The output of high-pass filter 24 is provided to buffer stage 29, comprising an operational amplifier 62 having a feedback circuit including resistors 66 and 68 and then to output stage 28.

Figure 4:
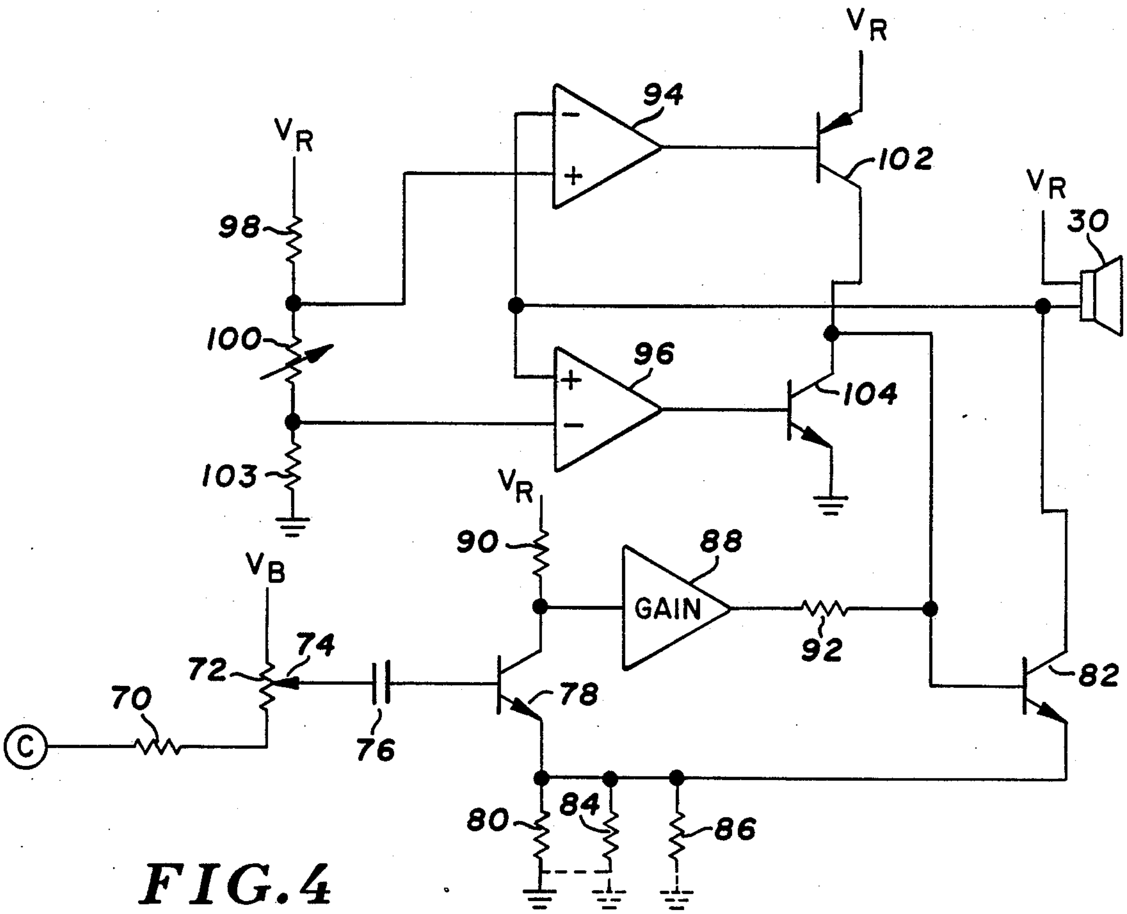
FIG. 4 is a schematic view of an output stage of the signal processing circuit illustrated in FIG. 1.

The modified electrical signal output of the high-pass filter, as amplified from the twelve dB gain stage, is supplied to a volume control through a resistor 70 preset to determine the gain (FIG. 4). The volume control, biased to a voltage level $V_B$, includes a resistor 72 and a wiper contact 74. The output of the volume control is supplied through a capacitor 76 to the base terminal of an NPN transistor 78. The emitter terminal of transistor 78 is connected to ground through a resistor 80 and also to the emitter terminal of an NPN transistor 82. Alternative resistors 84 and 86 may be connected between transistors 78 and 82, and ground, alternatively to resistor 80 or in parallel as indicated in broken lines, to provide a plurality of bias options. The collector terminal of transistor 78 is connected to the input terminal of an amplifier 88, which input is biased by a positive voltage $V_R$ through a resistor 90. The output of amplifier 88 is supplied to the base terminal of NPN transistor 82 through a resistor 92.

Also providing input to the base terminal of NPN transistor 82 is a circuit including comparator and clamping elements. First and second comparators 94 and 96 are biased at their positive and negative input terminals, respectively, first comparator 94 by a voltage determined by $V_R$ through a resistor 98, and second comparator by a voltage determined by $V_R$ through resistor 98, adjustable peak clipping resistor 100, and a resistor 103 connected between the clipping resistor and ground. The output of first comparator 94 is connected to the base terminal of a PNP transistor 102, while the second comparator output is connected to the base terminal of an NPN transistor 104. The collector terminal of PNP transistor 102 is connected to the collector terminal of NPN transistor 104, and these transistors are biased by virtue of positive voltage $V_R$ at the emitter terminal of PNP transistor 102.

Comparators 94 and 96 comprise a dual threshold comparator which establishes a +/−150 mv window for allowable signal excursion, depending upon the resistance of peak clipping resistor 100. More particularly, as the clipping resistance is increased, the allowable signal excursion also increases. The clamping elements, transistors 102 and 104, turn on or off with first and second threshold comparators 94 and 96, respectively. The output of the clamping elements is provided to the base terminal of NPN transistor 82 from their collector terminals. The emitter terminal of transistor 104 is connected to ground. The processed signal is provided from the collector terminal of NPN transistor 82 to receiver 30, which is biased to positive voltage $V_R$. The processed signal also is provided as an input to the negative input terminal of comparator 94 and the positive input terminal of comparator 96, to control the level at which each comparator is turned on and off.

Figure 5:
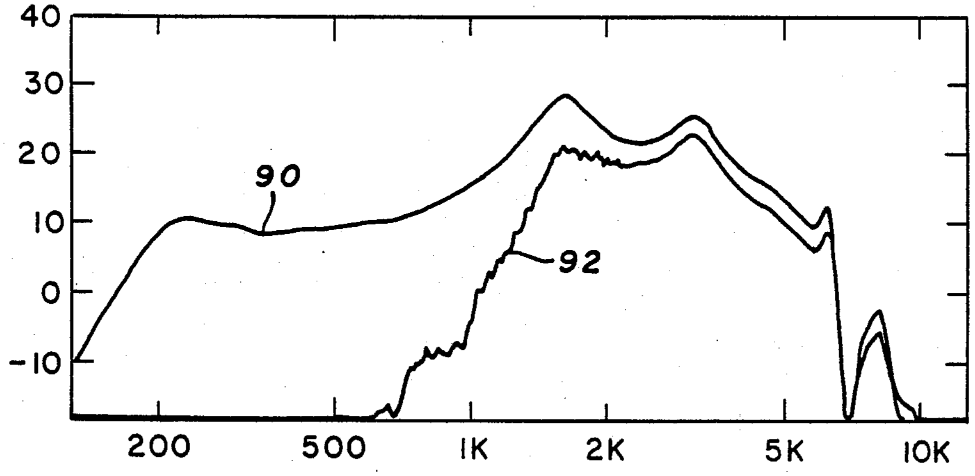
FIG. 5 is a graph illustrating operation of the high-pass filter of FIG. 3.
Figure 6:
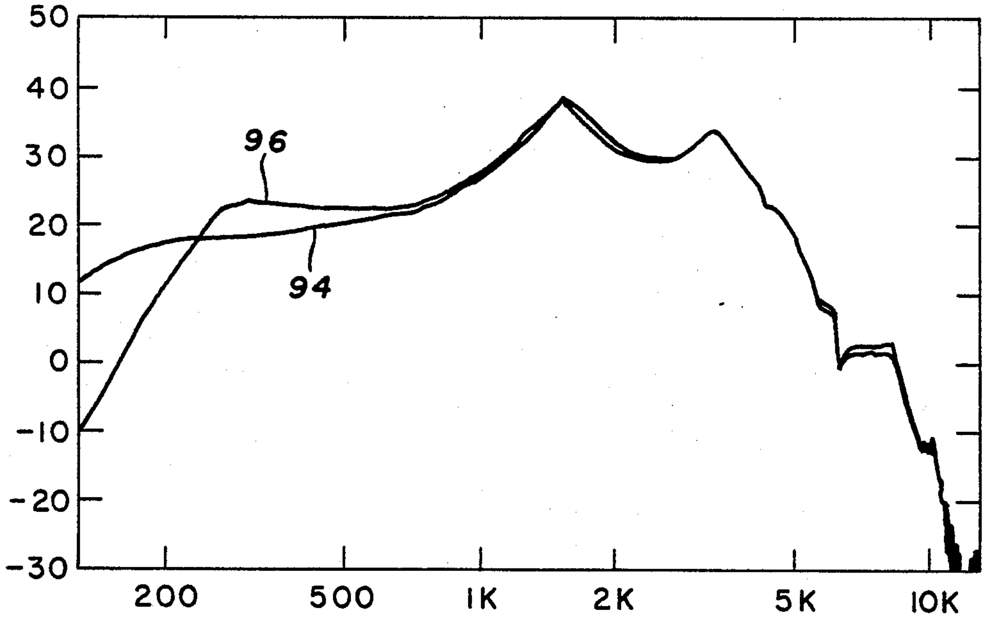
FIG. 6 is a graph similar to that in FIG. 5, but illustrating the operation of optional circuitry for reducing the sensitivity of the high-pass filter.

The operation of circuit 16 can be understood from the graphs of FIGS. 5–7. FIG. 5 is a graph of frequency on a logarhythmic scale vs. gain in decibels. Upper curve 90 illustrates the response of a hearing aid with high-pass filter 24 to a sixty-seven dB sound pressure level broadband noise input signal having a flat spectrum. Lower curve 92 shows the response to an eighty-seven dB sound pressure level input signal. Above the cut-off frequency level, approximately 1500 Hz, there is a comparatively slight decrease in gain, for example three dB at a frequency of 5000 Hz. Below the cut-off level, there is a rapidly increasing gap between the sixty-seven dB and eighty-seven dB filtered signals, for example a twenty dB reduction at approximately 700 Hz, and about a thirty dB reduction at the 300 Hz frequency level. The amount of adaptation is quite large compared to prior art hearing aid circuits, principally due to the sensitivity of rectifier 36.

FIG. 6 illustrates curves 94 and 96 at sixty-seven dB sound pressure level and eighty-seven dB sound pressure level, respectively as in FIG. 5, but with node 46 (see FIG. 2) at zero voltage, equivalent to ground. Such a connection renders high-pass filter 24 significantly less sensitive to changes in incoming sound pressure level, as can be seen from a comparison of the graph in FIG. 6 with that in FIG. 5. By increasing the capacitance of holding capacitor 38, the response time of the high-pass filter is increased, but the smoothing of the rectifier output is enhanced.

Figure 7A:
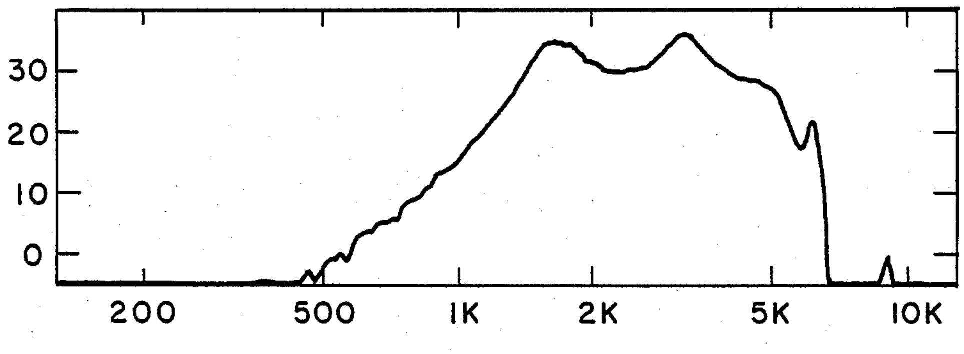
FIGS. 7A and 7B are graphs similar to those in FIGS. 5 and 6, illustrating the operation of optional circuitry for adjusting the cut-off frequency in quiet environments.
Figure 7B:
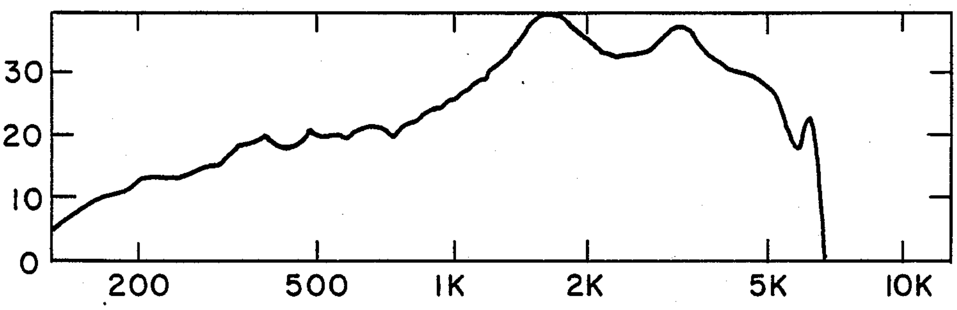

The operation of shunt resistor 50 is best understood with reference to FIGS. 7A and 7B, representing the response of high-pass filter 24 to the same SPL input, but with low and high resistance, respectively, selected for shunt resistor 50. When the shunt resistor has a minimum resistance as depicted in FIG. 7A, a maximum amount of current is bled off, causing the three dB cut-off frequency to be higher. Consequently there is less low frequency gain from the hearing aid in quiet environments. By contrast, FIG. 7B illustrates high-pass filter response when shunt resistor 50 is given a maximum resistance. With bleed off held to a minimum, the three dB cut-off frequency is at its lowest level, resulting in greater relative low frequency gain in quiet environments. Of course, intermediate resistances selected for the shunt resistor result in intermediate location of the cut-off frequency in quiet environments, so that the hearing aid may be tailored to suit individual needs.

In a particular embodiment of circuit 16, the following values have been found satisfactory for the various components:

$V_R$: 1.3 volts (typical)

$V_B$: 0.9 volts
Capacitors 32, 34, 38 & 80: 0.047 mfd.
Capacitors 54 & 58: 0.015 mfd.
Shunt resistor 50: 100k–700k ohms More rapid excursions in cut-off frequency, and thus more effective relative suppression of low frequency noise, result from the fact that the entire amplified electrical signal, and not merely a low frequency portion of the signal, is used to regulate the adaptive high-pass filter. Use of the entire signal also enables an effective response to noise in medium frequency ranges. Due to greater excursions in cut-off frequency, there is no need for an automatic gain control circuit. This not only eliminates AGC artifacts, but reduces the space required for the signal processing circuitry, whereby the circuit is more readily provided on a single integrated circuit chip. A further reduction in required space for the circuitry stems from the elimination of the low-pass filter preceding the peak detector in prior art signal processing circuits.

What is claimed is:

1. A signal processing circuit for a hearing aid, including:

a sound pressure level sensing means for sensing an audio signal and generating an electrical signal corresponding to said sensed audio signal;

a broadband signal amplifying means for amplifying said electrical signal to produce an amplified electrical signal;

a boardband detecting means, having as an input substantially the entire frequency spectrum of said amplified electrical signal, said detecting means generating an output comprising a control signal having a control signal level proportional to said amplified electrical signal substantially over said entire frequency spectrum;

an adaptive high-pass filtering means, having as a first input said amplified electrical signal, and as a second input said control signal, for selectively suppressing a low frequency portion of said amplifier electrical signal to generate a selectively modified signal, the frequency bandwidth of said suppressed low frequency portion, relative to the width of the entire frequency spectrum of said amplified electrical signal, increasing with said control signal level; and a receiver means for generating an audio signal corresponding to said selectively modified signal.

2. The circuit of claim 1 wherein:

said control signal level is a voltage level.

3. The circuit of claim 2 wherein:

said detecting means includes a rectifier and a smoothing filter, said smoothing filter including a hold capacitor having a capacitance selected to provide a balance between a rapid response to changes in said amplified electrical signal, and the degree of smoothing of said control signal.

4. The circuit of claim 3 further including:

an adjustable control means for providing only a selected fraction of said control signal level to said high-pass filtering means.

5. The circuit of claim 4 wherein:

said control means comprises a shunt resistance electrically connected between a node biased to a selected positive voltage, and an output node of said rectifier.

6. The circuit of claim 5 wherein:

said shunt resistance is adjustable to selectively alter said selected fraction of said control signal level.

7. The circuit of claim 3 further including:

means for bleeding off a portion of a peak voltage sensed by said rectifier, including a shunt resistance between an output node of said rectifier and a node biased at a selected positive voltage.

8. The circuit of claim 2 wherein:

said adaptive high-pass filtering means has a variable cut-off frequency that separates said low frequency portion from the remainder of said frequency spectrum of said amplified electrical signal, the frequency level of said variable cut-off frequency increasing and decreasing along with said control signal level.

9. A process for selectively enhancing a portion of the frequency spectrum of an audio signal, including the steps of:

sensing an audio signal, generating an electrical signal corresponding to the audio signal, and amplifying said electrical signal to produce an amplified electrical signal;

generating a direct current signal, having a control voltage proportional to the level of said amplified electrical signal over substantially the entire frequency spectrum of said amplified electrical signal;

selectively filtering said amplified electrical signal to suppress a low frequency portion of said amplified electrical signal to generate a modified electrical signal, while simultaneously applying said control voltage to determine the ratio of the bandwidth of to said low frequency portion of the bandwidth of said entire frequency spectrum of said signal, said ratio increasing and decreasing as said control voltage increases and decreases, respectively; and generating a selectively enhanced audio signal corresponding to said modified electrical signal.

10. The process of claim 9 wherein:

said step of selectively filtering said amplified electrical signal includes the step of selectively varying the fraction of said control voltage applied to determine said ratio.

11. The process of claim 9 wherein:

said step of generating a direct current signal includes the step of rectifying said amplified electrical signal to provide a rectified signal, and filtering the rectified signal.

12. The process of claim 11 wherein the step of filtering the rectified signal further includes the step of selecting a filtering capacitance sufficiently large for smoothing said rectified signal, and sufficiently small whereby said rectified signal has a desired sensitivity to changes in said amplifier electrical signal.

13. The process of claim 11 wherein:

the step of rectifying and filtering said amplified electrical signal includes bleeding off a portion of a peak voltage of said amplified electrical signal.

14. A signal processing circuit for a hearing aid, including:

a sound pressure level sensing means for sensing an audio signal and generating an electrical signal corresponding to said sensed audio signal;

a broadband signal amplifying means for amplifying said electrical signal to produce an amplified electrical signal;

a broadband detecting means, having as an input substantially the entire frequency spectrum of said amplified electrical signal, for generating a control signal having a control signal level proportional to said amplified electrical signal;

an adaptive high-pass filtering means, having as a first input said amplified electrical signal, and as a second input said control signal, for selectively suppressing a selected portion of said amplified electrical signal to generate a selectively modified signal, wherein said selected portion includes at least low range frequencies of said amplified electrical signal and wherein the frequency bandwidth of said suppressed selected portion, relative to the bandwidth of the entire frequency spectrum of said amplified electrical signal, increases with the level of said control signal; and receiver means for generating an audio signal corresponding to said selectively modified signal.

15. The circuit of claim 14 wherein:

said selected portion of said amplified electrical signal further includes medium range frequencies and high range frequencies within said frequency spectrum of said amplified electrical signal, responsive to the sensing of sound pressure of at least a selected sound pressure level by said sound pressure level sensing means.

16. The circuit of claim 15 wherein:

said selected sound pressure level is approximately 85 decibels.

17. The circuit of claim 3 wherein:

said adaptive high-pass filtering means comprises a voltage controlled two pole high-pass filter.

* * * * *

UNITED STATES PATENT AND TRADEMARK OFFICE

CERTIFICATE OF CORRECTION

PATENT NO. : 4,790,018

DATED : December 6, 1988

INVENTOR(S) : David A. Preves et al

It is certified that error appears in the above-identified patent and that said Letters Patent is hereby corrected as shown below:

Column 7, Line 30, "boardband" should read -- broadband --.

Column 7, Line 40, "amplifier" should read -- amplified --.

Column 8, Line 53, "amplifier" should read -- amplified --.

Signed and Sealed this

Sixteenth Day of May, 1989

Attest:

DONALD J. QUIGG

*Attesting Officer*

*Commissioner of Patents and Trademarks*